United States Patent
Ottini et al.

(10) Patent No.: US 6,215,436 B1
(45) Date of Patent: Apr. 10, 2001

(54) HIGH-SPEED DIFFERENTIAL DECODER WITH REDUCED AREA CONSUMPTION

(75) Inventors: Daniele Ottini, Pavia; Melchiorre Bruccoleri, Rho; Davide Demicheli; Paola Demartini, both of Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/296,985

(22) Filed: Apr. 22, 1999

(30) Foreign Application Priority Data

Apr. 27, 1998 (IT) .............................................. MI98A0898

(51) Int. Cl.[7] ..................................................... H03M 1/36
(52) U.S. Cl. .......................... 341/160; 341/144; 341/155
(58) Field of Search .................................... 341/160, 144, 341/155, 159, 76

(56) References Cited

U.S. PATENT DOCUMENTS

| 4,292,625 | * | 9/1981 | Schoeff | 341/155 |
| 4,568,910 | * | 2/1986 | Sekino et al. | 341/155 |
| 5,315,301 | * | 5/1994 | Hosotani et al. | 341/160 |
| 5,644,312 | * | 7/1997 | Deevy et al. | 341/160 |
| 5,886,653 | * | 3/1999 | Ishigami | 341/144 |

* cited by examiner

Primary Examiner—Howard L. Williams
Assistant Examiner—Jean Bruner Jeanglaude
(74) Attorney, Agent, or Firm—Theodore E. Galanthay; Allen, Dyer Doppelt, Milbrath & Gilchrist, P.A.

(57) ABSTRACT

A differential decoder has a wide output dynamic range and reduced area consumption. The decoder includes a plurality of inputs which are correlated to a plurality of output lines. The output lines are driven by respective NPN type bipolar transistors which are connected to the output lines by their emitters while the input signals are fed to their bases. The decoder also includes a plurality of additional output lines which are complementary to the output lines and another plurality of NPN type bipolar transistors which are suitable to drive the additional output lines. The additional bipolar transistors are connected to the additional output lines through their emitter terminals, and are connected to the base and collector terminals of the bipolar transistors that drive the output lines, through their base and collector terminals.

23 Claims, 3 Drawing Sheets

US 6,215,436 B1

HIGH-SPEED DIFFERENTIAL DECODER WITH REDUCED AREA CONSUMPTION

FIELD OF THE INVENTION

The present invention relates to a high-speed differential decoder with reduced area consumption. More particularly, the present invention relates to a differential decoder used, for example, in a high-speed flash analog/digital converter.

BACKGROUND OF THE INVENTION

A known converter, for example a flash converter such as the one shown in FIG. 3, includes a plurality of comparators 1, which receive an input signal Vin in addition to a reference signal generated by a string of resistors 2. Depending on the value of the input signal Vin, the comparators can have an output signal which is higher than the input signal, for example, a logic value of 1, or the comparator can have an output signal which is lower than the input signal, a logic value of 0. Therefore, at the output of the comparators, a plurality of bits are obtained in which some have the logic value 1 and others have the logic value 0. Accordingly, the output is a thermometer code, which must be converted into a more suitable code, for example, a Gray code.

The logic circuit 3 shown in FIG. 3 is designed to convert the thermometer code output from the comparators 1 into a code in which, for example, all the bits have the value 0 except for the single bit that indicates the value of the input signal Vin. The logic value 1 output from the logic circuits 3 indicates the transition point, i.e. the point at which the output signal of the comparator changes from the value 1 to the value 0 or vice versa. The object is to output a numeric code which is the equivalent of the input signal Vin. Therefore, the logic circuits 3, which are usually gates of the NOR or NAND type, output a plurality of bits, only one of which is different from all the others.

A PLA type decoder 4 is cascade-connected to the logic circuits 3. It appropriately decodes the signal received from the logic circuits 3 in order to output a signal which indicates the value of the input signal Vin.

FIG. 2 illustrates an example of a known type of PLA which shows, by way of example, only three inputs IN0, IN1, IN2 and three outputs OUT0, OUT1, OUT2. In FIG. 2, the output lines designated by OUT0–OUT2 are connected to the inputs IN0–IN1 through a plurality of transistors of the NPN type. In particular, the transistors 10 and 11 are connected to the input IN2 and their base and collector terminals are common-connected and connected to the output lines OUT2 and OUT1 respectively. The transistors 12 and 13 are instead connected to the input IN1 and their base and collector terminals are common-connected and connected to the output lines OUT2 and OUT0 respectively. Finally, the transistor 14 is connected to the input IN0 and to the output line OUT1.

All the NPN bipolar transistors 10–14 are connected to the supply voltage by their respective collector terminals. Current sources 15, 16 and 17 are provided for the output lines.

The above-proposed structure, shown in FIG. 2, suffers the drawback caused by the output dynamic range of the signal being limited by the need to have high speed logic circuits 3 (as shown in FIG. 3) upstream of the PLA decoder 4. Accordingly, the output signal may not be determined with certainty, because the difference in voltage levels between a logic value 1 and a logic value 0 is very small.

SUMMARY OF THE INVENTION

An object of the present invention is to provide a differential decoder with a wide output dynamic range and with reduced area consumption which substantially improves the output dynamic range of the signal, avoiding the possible uncertainties of the prior art. Within the scope of this object, a purpose of the present invention is to provide a differential decoder which increases the dynamic range of the output without introducing complementary devices.

Another object of the present invention is to provide such a differential decoder which achieves signal/noise ratio advantages on the subsequent processing of the output signal. Another object of the present invention is to provide such a differential decoder which allows the use of fully differential ECL (Emitter Coupled Logic or Current Mode Logic) logic circuits. Still another object of the present invention is to provide such a differential decoder which can eliminate the uncertainty of the output signal from the logic circuits upstream of the decoder. Furthermore, another object of the present invention is to provide such a differential decoder which is highly reliable, relatively easy to manufacture and cost competitive.

These objects and others which will become apparent hereinafter are achieved by a differential decoder with a wide output dynamic range and reduced area consumption comprising a plurality of inputs which are correlated to a plurality of output lines. The output lines are driven by respective NPN type bipolar transistors which are connected to the output lines by their emitter terminals. The input signals are fed to their base terminals. The decoder further comprises a plurality of additional output lines which are complementary to the output lines and another plurality of NPN type bipolar transistors which are suitable to drive the additional output lines. The additional bipolar transistors are connected to the additional output lines by their emitter terminals and connected to the base and collector terminals, of the bipolar transistors that drive the output lines, by their base and collector terminals.

BRIEF DESCRIPTION OF THE DRAWINGS

Further characteristics and advantages of the present invention will become apparent from the following detailed description of a preferred embodiment of the decoder according to the invention, illustrated only by way of a nonlimiting example in the accompanying drawings, wherein.

DETAILED DESCRIPTION OF THE PREFERRED EMBODIMENT

Figure 1:
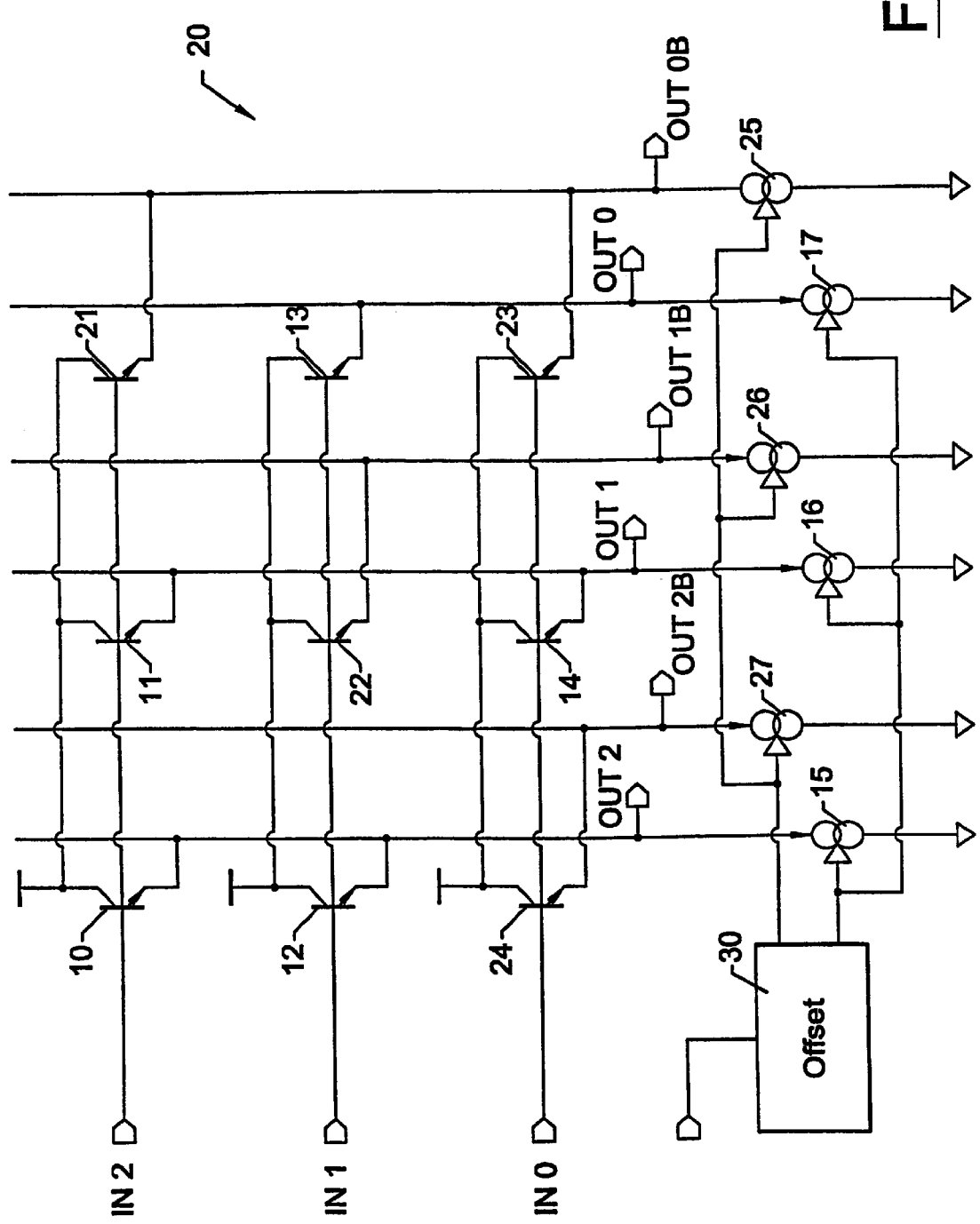
FIG. 1 is a circuit diagram of a decoder according to the present invention.
Figure 2:
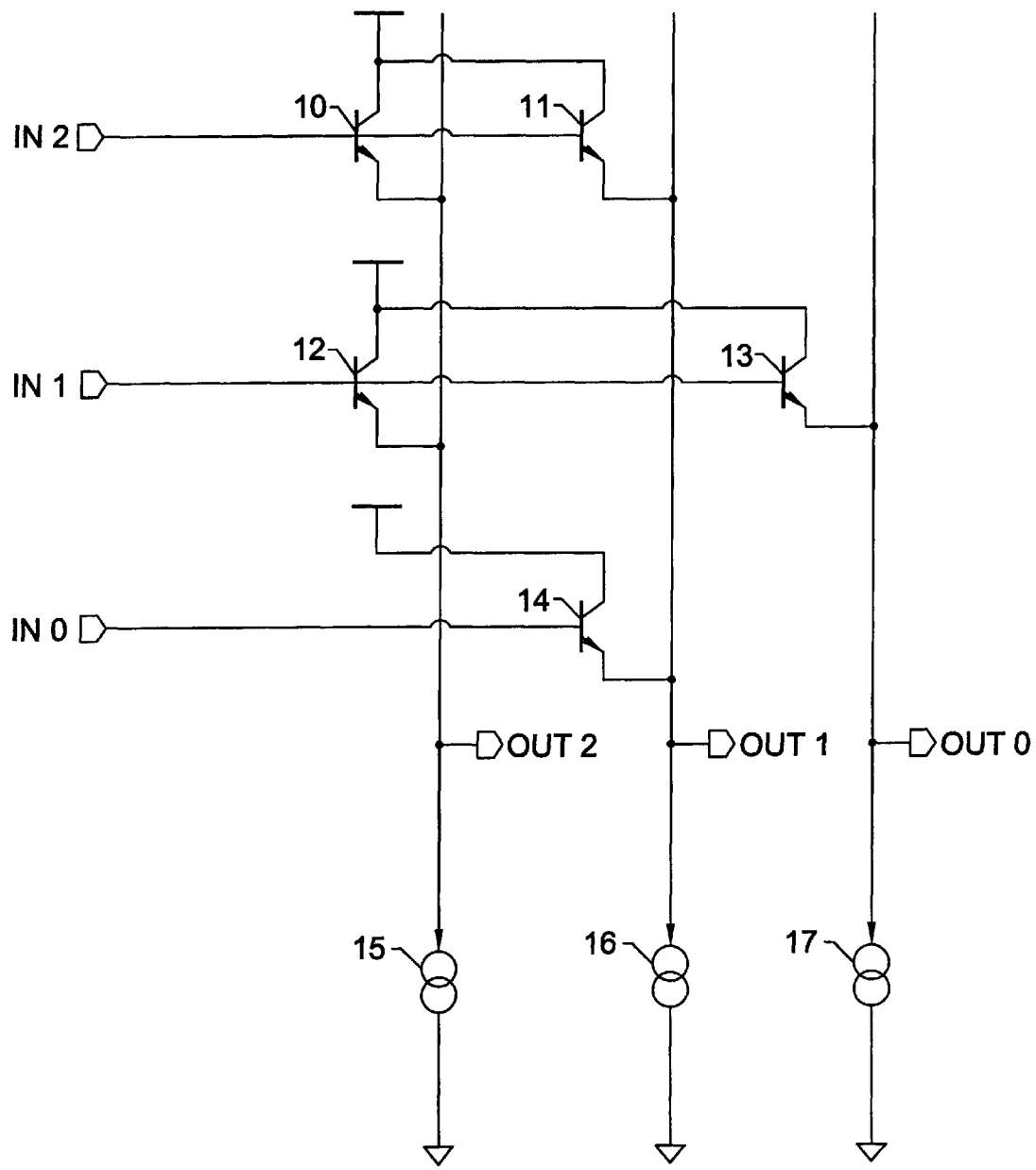
FIG. 2 is a circuit diagram of a prior art decoder.
Figure 3:
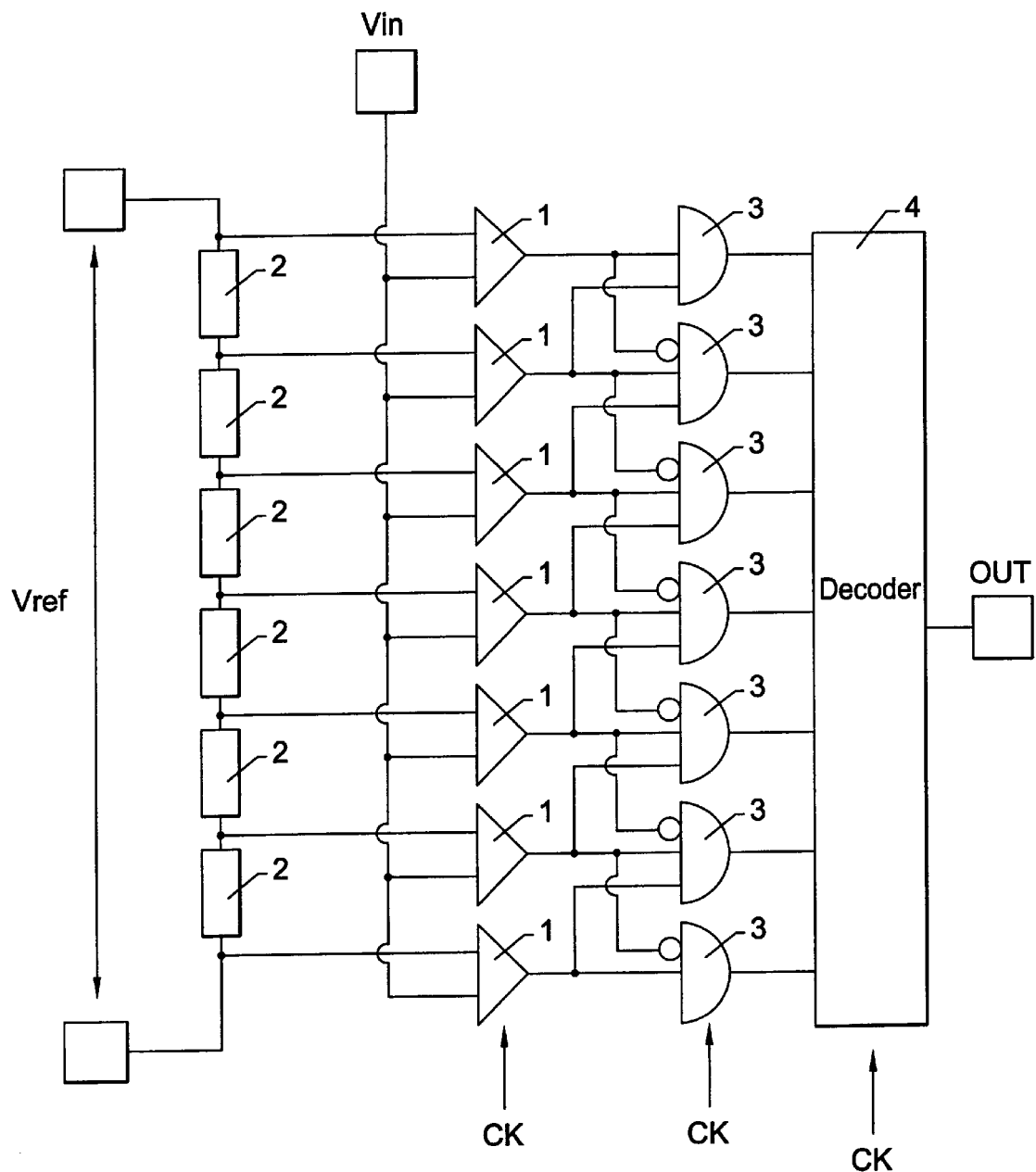
FIG. 3 is a block diagram of an example of an application of the decoder according to the present invention, shown in FIG. 1, to a conventional flash-type converter.

With reference to the above figures, and particularly to FIG. 1, because FIGS. 2 and 3 have already been described, the decoder 20 according to the present invention, comprises a plurality of inputs IN0–IN2, and a plurality of outputs OUT0–OUT2 complemented by the complementary output lines OUT0B–OUT2B. The decoder 20 can, for example, be used as the decoder 4 of FIG. 3.

In FIG. 1, the same reference numerals have been given to the elements that correspond to those shown in FIG. 2. Therefore, the transistors 10, 11, 12, 13 and 14 correspond to the transistors 10–14 shown in FIG. 2.

The circuit according to the invention shown in FIG. 1 further comprises for each output line, as mentioned, complementary output lines OUT0B–OUT2B to which NPN type bipolar transistors 21–24 are connected which complement the bipolar transistors 10–14. In particular, the bipolar transistor 21 is connected to the line OUT0B by its emitter terminal, while its base and collector terminals are respectively connected in common with the transistors 10 and 11. A transistor 22 is connected, by its emitter terminal, to the line OUT1B, and its base and collector terminals are respectively connected in common with transistors 12 and 13. A transistor 23 is connected, by its emitter terminal, to the line OUT0B and, connected by its base and collector terminals, to the base and collector terminals of the transistor 14 and of a transistor 24, of which the emitter terminal is connected to the line OUT2B.

The addition of the transistors 21, 22, 23 and 24 with respect to the circuit diagram of FIG. 2 does not entail a high area consumption since all the base and collector terminals of the transistors are in common with the bipolar transistors that are already present in the circuit of FIG. 2. Likewise, the lines OUT0B, OUT1B and OUT2B have current sources 25, 26 and 27 which correspond to the current sources 17, 16 and 15 respectively.

The circuit of FIG. 2, of a known type, has an output signal which, in order to be evaluated, must be compared with a reference which is appropriately supplied externally and must be absolutely precise, so as to allow evaluation of the value of the signal output from the decoder.

In the circuit according to the present invention, instead, there is no need to have a reference signal. This is so because the output of the decoder is differential, since each line has its own complementary or inverted line. In this manner, the dynamic range of the signal is substantially doubled, allowing assured determination of the value of the signal output from the decoder. Therefore, in this manner, a differential voltage is obtained at the output instead of a voltage value which must be compared with the reference voltage.

Furthermore, the circuit of the decoder according to the present invention is suitable to prevent an error, caused by noise in the logic circuits upstream of the decoder, from generating a metastable state in the downstream logic, i.e. in the decoder. This type of error can occur because an output of the decoder and its complementary line might both reach the high logic level if the code input to the decoder had more than one active signal. This is because the comparators do not operate correctly.

In order to avoid this problem, the circuit according to the invention introduces a systematic offset on the complementary signals, i.e. on the complementary output lines of the circuit. Therefore, with reference to FIG. 1, an offset block 30 which introduces a preset offset on the complementary lines OUT0B-OUT2B is provided. This approach avoids the metastable state in the output of the decoder even if the signals input to the decoder have more than one active signal.

In practice it has been observed that the decoder according to the invention fully achieves the intended objects, because it allows a wider dynamic range of the output signal, with significant signal/noise ratio advantages on the subsequent processing that the signal undergoes.

Moreover, the use of differential decoder logic eliminates the need for a reference voltage as provided in conventional circuits. The above-described invention is achieved with a minimal increase in circuit complexity and area occupation, since the transistors that are added with respect to a conventional decoder share their base and collector terminals with the transistors that are normally present. The above described decoder is susceptible to numerous modifications and variations, all of which are within the scope of the inventive concept; and, the details may be implemented according to specific requirements and to the state of the art.

What is claimed is:

1. A differential decoder comprising:
    a plurality of inputs;
    a plurality of output lines correlated to the plurality of inputs;
    a first plurality of bipolar transistors having emitters connected to respective output lines, and having bases connected to respective inputs;
    a plurality of complementary output lines which are complementary to the plurality of output lines; and
    a second plurality of bipolar transistors having emitters connected to respective complementary output lines, and having bases and collectors connected to respective first bipolar transistors.

2. A differential decoder according to claim 1, wherein each one of the plurality of output lines, and each one of the plurality of complementary output lines, comprises a current source.

3. A differential decoder according to claim 1, further comprising an offset device for introducing an offset in the output lines or in t complementary output lines, wherein output signals in which the offset is introduced are differentiated by the offset with respect to output signals without the offset.

4. A differential decoder according to claim 1, wherein the collectors of the first and second pluralities of bipolar transistors are connected to a supply voltage.

5. A differential decoder according to claim 1, wherein the output lines and the complementary output lines are connected between the supply voltage and the ground.

6. A differential decoder according to claim 1, wherein each of the first and second pluralities of bipolar transistors comprises an NPN type bipolar transistor.

7. A differential decoder comprising:
    a plurality of inputs;
    a plurality of output lines;
    a plurality of complementary output lines;
    a first plurality of bipolar transistors connected between respective inputs and respective output lines; and
    a second plurality of bipolar transistors connected between respective inputs and respective complementary output lines;
    the second bipolar transistors being connected to respective first bipolar transistors.

8. A differential decoder according to claim 7, wherein the first plurality of bipolar transistors have emitters connected to the respective output lines, and have bases connected to the respective inputs, and wherein the second plurality of bipolar transistors have emitters connected to the respective complementary output lines, and have bases and collectors connected to respective first bipolar transistors.

9. A differential decoder according to claim 7, wherein each one of the plurality of output lines, and each one of the plurality of complementary output lines, comprises a current source.

10. A differential decoder according to claim 7, further comprising an offset device for introducing an offset in the output lines or in the complementary output lines, wherein output signals in which the offset is introduced are differentiated by the offset with respect to output signals without the offset.

11. A differential decoder according to claim 7, wherein the collectors of the first and second pluralities of bipolar transistors are connected to a supply voltage.

12. A differential decoder according to claim 7, wherein the output lines and the complementary output lines are connected between the supply voltage and the ground.

13. A differential decoder according to claim 7, wherein each of the first and second pluralities of bipolar transistors comprises an NPN type bipolar transistor.

14. An analog/digital converter comprising:
   a conversion circuit for receiving analog input signals and producing digital output signals; and
   a differential decoder for decoding the digital output signals from the conversion circuit;
   the differential decoder comprising
      a plurality of inputs;
      a plurality of output lines;
      a plurality of complementary output lines; and
      a first plurality of bipolar transistors connected to respective output lines; and
      a second plurality of bipolar transistors connected to respective complementary output lines and connected to respective first bipolar transistors.

15. An analog/digital converter according to claim 14, wherein the first plurality of bipolar transistors have emitters connected to the respective output lines, and have bases connected to the respective inputs, and wherein the second plurality of bipolar transistors have emitters connected to the respective complementary output lines, and have bases and collectors connected to respective first bipolar transistors.

16. An analog/digital converter according to claim 14, wherein each one of the plurality of output lines, and each one of the plurality of complementary output lines, comprises a current source.

17. An analog/digital converter according to claim 14, wherein the differential decoder further comprises an offset device for introducing an offset in the output lines or in the complementary output lines, wherein output signals in which the offset is introduced are differentiated by the offset with respect to output signals of without the offset.

18. An analog/digital converter according to claim 14, wherein the collectors of the first and second pluralities of bipolar transistors are connected to a supply voltage.

19. An analog/digital converter according to claim 14, wherein the output lines and the complementary output lines are connected between the supply voltage and the ground.

20. An analog/digital converter according to claim 14, wherein the analog/digital converter is a flash type analog/digital converter.

21. An analog/digital converter according to claim 14, wherein each of the first and second pluralities of bipolar transistors comprise an NPN type bipolar transistor.

22. A method of analog to digital conversion comprising the steps of:
   receiving a plurality of analog input signals;
   converting the analog signals to first digital signals;
   processing each of the first digital signals through a first plurality of bipolar transistors connected to respective output lines, and a second plurality of bipolar transistors connected to respective complementary output lines and connected to respective first bipolar transistors, to generate second digital signals and complements thereof.

23. A method according to claim 22, further comprising the steps of:
   introducing an offset in the output lines or in the complementary output lines; and
   differentiating between output signals based on the offset.

* * * * *

UNITED STATES PATENT AND TRADEMARK OFFICE
CERTIFICATE OF CORRECTION

| | |
|---|---|
| PATENT NO. | : 6,215,436 B1 |
| DATED | : April 10, 2001 |
| INVENTOR(S) | : Daniele Ottini, Melchiorre Bruccoleri, Davide Demicheli, Paola Demartini |

It is certified that error appears in the above-identified patent and that said Letters Patent is hereby corrected as shown below:

Column 4,
Line 26, delete "in t complementary" insert -- in the complementary --

Signed and Sealed this

Second Day of October, 2001

Attest:

*Nicholas P. Godici*

NICHOLAS P. GODICI
*Acting Director of the United States Patent and Trademark Office*

*Attesting Officer*